(12) United States Patent
Hunter

(10) Patent No.: US 10,135,428 B2
(45) Date of Patent: Nov. 20, 2018

(54) METHODS AND APPARATUS FOR A LOW POWER RELAXATION OSCILLATOR

(71) Applicant: Texas Instruments Incorporated, Dallas, TX (US)

(72) Inventor: Bradford Lawrence Hunter, Spicewood, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 15/252,725

(22) Filed: Aug. 31, 2016

(65) Prior Publication Data

US 2018/0062626 A1    Mar. 1, 2018

(51) Int. Cl.
*H03K 4/501* (2006.01)
*H03B 5/24* (2006.01)

(52) U.S. Cl.
CPC ............... *H03K 4/501* (2013.01); *H03B 5/24* (2013.01)

(58) Field of Classification Search
CPC .................................................... H03K 4/501
USPC ......................................................... 331/111
See application file for complete search history.

(56) References Cited

U.S. PATENT DOCUMENTS

| | | | |
|---|---|---|---|
| 3,831,113 A | 8/1974 | Ahmed | |
| 4,560,954 A | 12/1985 | Leach | |
| 6,020,792 A | 2/2000 | Nolan et al. | |
| 6,720,836 B2 | 4/2004 | Lin | |
| 7,982,549 B1 | 7/2011 | Husted et al. | |
| 8,106,715 B1 | 1/2012 | Nezamfar et al. | |
| 2005/0073370 A1 | 4/2005 | Mitsuda | |
| 2009/0072918 A1* | 3/2009 | Chung | H03K 4/501 331/113 R |
| 2010/0176892 A1 | 7/2010 | Thompson et al. | |
| 2012/0319788 A1 | 12/2012 | Wadhwa et al. | |
| 2014/0049327 A1 | 2/2014 | Bruset et al. | |
| 2014/0375392 A1 | 12/2014 | Sinitsky et al. | |

OTHER PUBLICATIONS

PCT Search Report for PCT Application No. PCT/US17/49715, dated Nov. 30, 2017 (1 page).

\* cited by examiner

*Primary Examiner* — Joseph Chang
(74) *Attorney, Agent, or Firm* — Lawrence J. Bassuk; Charles A. Brill; Frank D. Cimino

(57) ABSTRACT

In a described example, an apparatus includes: a capacitor coupled to receive a current at a first terminal and having a second terminal coupled to ground; a first comparator coupled to a voltage at the first terminal of the capacitor and to a first reference voltage; a second comparator coupled to the voltage at the first terminal of the capacitor and to a second reference voltage that is different from the first reference voltage, and having an enable input coupled to the output of the first comparator; a discharge circuit coupled to the capacitor and enabled by the output of the second comparator; and a toggle circuit coupled to the output of the second comparator. Methods are disclosed.

20 Claims, 3 Drawing Sheets

METHODS AND APPARATUS FOR A LOW POWER RELAXATION OSCILLATOR

TECHNICAL FIELD

This application relates in general to oscillator circuits, and more particularly to methods and apparatus for an accurate, temperature stable, low power RC oscillator.

BACKGROUND

Oscillators are electronic circuits that generally convert energy into a periodic signal. Oscillators often provide repeating constant or highly regular frequency signals such as clock signals. The output of the oscillator can be a variety of waveforms including sinusoidal, triangular or square waves. The quality of an oscillator is described by the duty cycle, thermal stability and more recently the power consumption. Duty cycle relates to the amount of time a signal is above a threshold. Thermal stability indicates how much frequency drift an oscillator experiences across its operating temperature range. Power consumption is part of power management and in the current era of battery powered mobile devices, therefore power consumption is of significant importance in an oscillator. The oscillators tend to run continuously, consuming power even when other parts of a circuit are in a sleep mode, making power consumption in oscillators critical to power reduction in a circuit.

Oscillators include at least two types: tuned oscillators and relaxation oscillators. While tuned oscillators have their uses in high power and high precision applications, the relaxation oscillator circuit is a good candidate for oscillators in an integrated circuit because a relaxation oscillator requires little silicon area, can be completely fabricated on an integrated circuit, and requires neither a crystal nor an inductor to operate.

A relaxation oscillator works by charging a capacitor to a threshold voltage $V_T$. When the capacitor charges to the voltage $V_T$ the capacitor discharges, and the process repeats. The capacitor typically charges from a DC voltage supply coupled through a resistor. The RC time constant determines the frequency of the relaxation oscillator output. A simple relaxation oscillator that uses an RC network to determine its frequency can be prone to frequency drift, because the resistor and capacitor values vary with temperature. Components that are commonly available in integrated circuit processes are positive temperature coefficient resistors (RTP) and negative temperature coefficient resistors (RTN). By using an RTN resistor and an RTP resistor in series or parallel, the temperature deviation of the overall resistance value can be made more stable across a temperature range.

FIG. 1 shows a block diagram of a conventional relaxation oscillator. The low power oscillator (LPO) 100 is a relaxation design that uses capacitor 104 and resistor 108 to create a ramping voltage. Comparator 110 triggers at a voltage on node 115, and the output of the comparator is coupled to a pair of NAND gates and to a final inverting buffer 120. The comparator reference voltage of node 115 is set by the values of resistors R3 and R2, based on the unbuffered LPO output. The power on switch (PWD) 102 is normally open, allowing the LPO to oscillate. In the open state, the pair of NAND gates operate as inverters. While PWD is asserted, the NAND gate outputs both go low, forcing the final output of the LPO to go to a constant high due to the inverting buffer 120.

In the relaxation oscillator 100, the comparator 110 provides a reliable trigger based on the ratio of resistors R2 and R3. When resistors R2 and R3 are located in close proximity to one another on an integrated circuit, the ratio can track well over process and temperature variations. The stability of the RC time constant of the ramping voltage can be further improved by making the resistors from a pair of resistors in parallel, a first resistor as a RTN and the second resistor as a RTP resistor, which are commonly available in various semiconductor fabrication processes. The delay time from a trigger event to the comparator output change also varies with power and temperature. Increasing power can shorten the comparator delay (reduce latency) and reduces dependency on temperature. However, this approach increases power consumption. Oscillators with improved thermal stability and with reduced current consumption are needed.

SUMMARY

In described examples, an apparatus includes: a capacitor coupled to receive a current at a first terminal and having a second terminal coupled to ground; a first comparator coupled to a voltage at the first terminal of the capacitor and to a first reference voltage; a second comparator coupled to the voltage at the first terminal of the capacitor and to a second reference voltage that is greater than the first reference voltage, and having an enable input coupled to the output of the first comparator; a discharge circuit coupled to the capacitor and enabled by the output of the second comparator; and a toggle circuit coupled to the output of the second comparator.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

With the popularity of battery powered electronics, low powered components and sub-systems are essential to extending the operating time of battery-powered devices. Oscillator designs are frequently important in reducing power consumption as the oscillators often run while other circuit sub-systems are in a sleep mode. A relaxation oscillator is a good design choice for a low power oscillator (LPO) due to the relatively low cost and ease of implementation in a standard IC process. Using a comparator in the relaxation oscillator design improves the frequency accuracy by triggering the oscillator at a known voltage; however, latency in the comparator can be a contributor to unwanted frequency drift as the delay between the trigger event and the output change varies with temperature and with comparator power. A higher power comparator reduces the latency and thermal variability but at the expense of higher current consumption.

In an aspect of the present application, an example arrangement uses a pair of comparators to detect a ramping voltage, while also reducing the amount of power consumed. Power reduction is achieved by using the first comparator as an enable circuit for the second comparator. The first comparator is a low power design. In one example the first comparator is provided with a bias current less than one micro amp. When the first low power comparator triggers, it enables a second comparator. The second comparator is a high power, low latency comparator that is only active for a brief time. The high bias power of the second comparator provides a low latency, resulting in negligible frequency variability of the oscillator across the thermal operating range.

Figure 1:
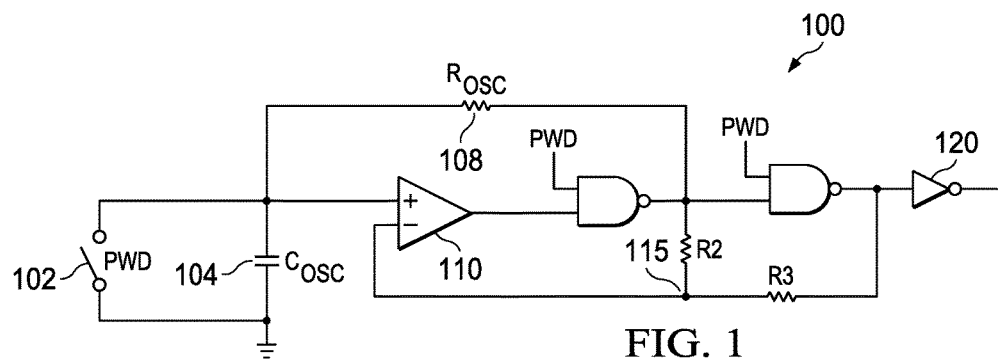
FIG. 1 is a block diagram of a prior art relaxation oscillator.
Figure 2:
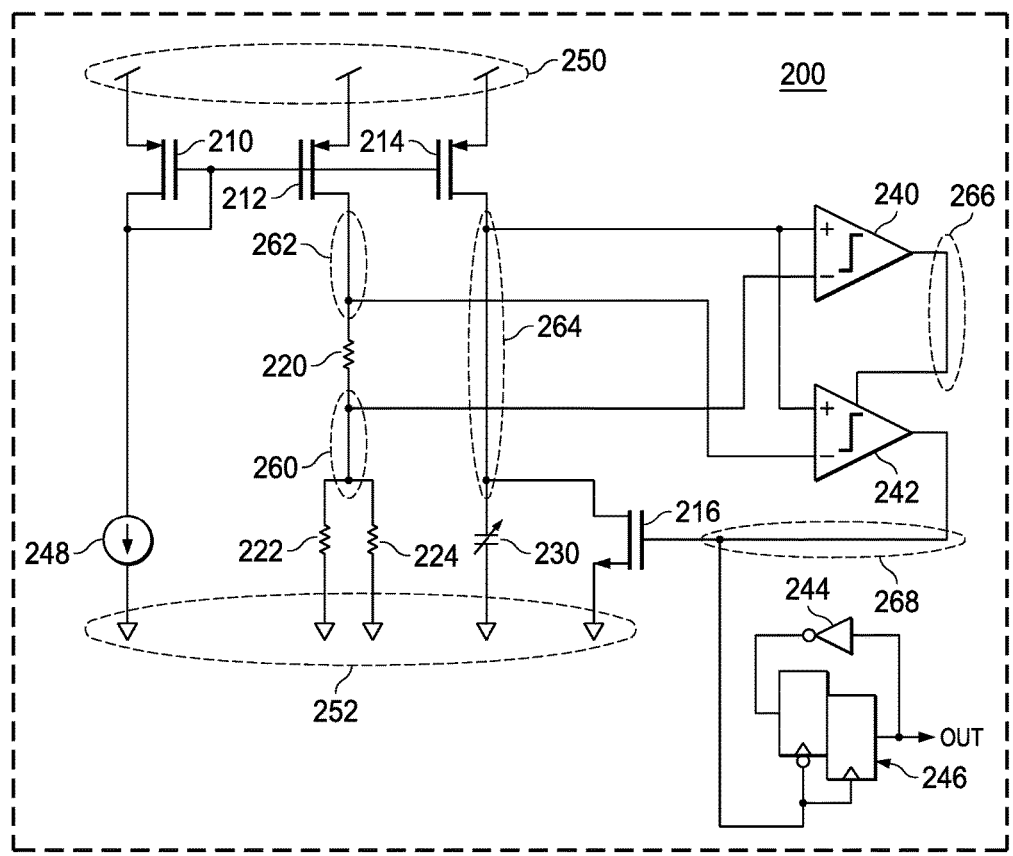
FIG. 2 is a block diagram of an example arrangement for a low power relaxation oscillator.

FIG. 2 is a block diagram of an example aspect of the present application for a low power relaxation oscillator 200. In FIG. 2, relaxation oscillator 200 includes: FETs 210, 212, 214, 216, resistors 220, 222, 224, capacitor 230, comparators 240 and 242, inverter 244, flip flop 246 and current source 248.

FETs 210, 212 and 214 form current mirrors with respective gate terminals coupled together. The source terminals of these FETs are coupled to power at node 250. The gate terminal of FET 210 is coupled to the drain terminal of FET 210 and to a terminal of the current source 248. The second terminal of the current source is coupled to ground node 252. Resistors 222 and 224 are coupled in parallel to ground node 252 and the second terminals of each resistor are coupled at node 260. Also coupled to node 260 is a terminal of resistor 220 and the inverting input of comparator 240. The second terminal of resistor 220 is coupled to the drain of FET 212 and the inverting terminal of comparator 242 at node 262.

Still referring to FIG. 2, capacitor 230 has one terminal coupled to ground node 252 and the second terminal of the capacitor and the non-inverting terminal of both comparators 240 and 242 are coupled to node 264. Also coupled to node 264 is the drain terminal of FET 216, the source terminal of FET 216 is coupled to ground node 252. The output of comparator 240 is coupled to the enable terminal of comparator 242 at node 266. The output of comparator 242 is coupled to the gate terminal of FET 216 at node 268. Both the inverting and non-inverting clock input of flip-flop 246 are coupled to node 268. The input of flip-flop 246 is coupled to output terminal of the inverter 244 and the output of the flip-flop is coupled to the input of inverter 244. The output of the flip-flop 246 is the output of the oscillator 200. A square wave output signal will be produced at the output node labeled OUT.

In the fabrication of the integrated circuit containing the components in the relaxation oscillator 200, size matching and physical proximity or co-location help ensure near identical electrical characteristics and/or thermal experience for some components. For example, FETs 212 and 214 are matched in size and are co-located on the integrated circuit to form a matching current mirror. Capacitor 230 is implemented as a metal-to-metal type capacitor that inherently has very little variation with temperature. Formed on the top-level metal, capacitor 230 can be laser trimmed to a desired value so that across a wafer, the relaxation oscillator can have a consistent frequency regardless of process variability. In another example arrangement, the capacitor 230 can be formed of many metal levels and is not laser trimmed. In this approach, multiple FETs are arranged in series with trim capacitors and can short the capacitors to ground when the FETs are closed, or can allow the capacitors to float when the FETs are open, thus providing an adjustable value. In an example arrangement, capacitor 230 was adjusted to near one pico-farad to ensure a consistent frequency. The first comparator 240 is an ultra-low power comparator that runs all the time. The second comparator 242 is a high power comparator that is enabled for short periods. The high power comparator 242 has a very fast latency between the trigger event and output switching compared to the overall clock period, so that across the operational temperature range, any variation in the latency will be negligible with respect to the overall clock period. The low power comparator 242 has a much longer latency time compared to the high power comparator 240, however because the low power comparator 242 is only used to turn on the high power comparator 240, its latency and any delays due to temperature are not reflected in the relaxation oscillator frequency. The threshold of the low power comparator 240 is set low enough so that the low power comparator 240 has time to enable the higher power oscillator 242 before the voltage at the node 264 reaches the higher threshold of the higher power oscillator 242. The output node OUT does not change value when the low power oscillator 240 changes state as the voltage at node 264 exceeds the lower threshold for the low power comparator, thus the low power comparator does not affect the relaxation oscillator frequency. The higher power comparator 242 is enabled by the lower power comparator 240 and waits until the voltage at node 264 exceeds the higher threshold to change output state and affects the output at node OUT. Resistor 222 has a positive temperature coefficient (RTP) and resistor 224 has a negative temperature coefficient (RTN). Resistor formulations are commonly available in integrated circuit processes to build RTP and RTN resistors. Resistors 222 and 224 are co-located and have the same resistance values, resulting in a temperature independent resistance across the operating temperature range. FET 216 is sized to be able to quickly discharge the full charged capacitor 230.

All voltages discussed are with respect to the ground node 252 unless otherwise noted. To setup internal bias voltages, the current source 248 establishes a current through FET 212 by the current mirror configuration. The current flowing through FET 212 results in voltages at nodes 262 and 260. The voltage at node 262 is higher than the voltage at node 260 and in an example arrangement, the voltage difference between node 262 and node 260 was about a tenth of a volt. The always on, low power comparator 240 uses the voltage from the lower voltage node 260 as its trigger voltage. The high power comparator 242 uses the voltage from the higher voltage node 262 as its trigger voltage. The effective resistance of resistors 220 and the parallel resistors 222, 224 makes a resistor of approximate value of (Resistance of 220+Resistance of 222||224). This resistor should be thermally stable. Any thermal variation in current source 248 will be cancelled by equal thermal instability of the voltage at node 264, and the comparator differences will cancel the thermal variations.

To form the ramping voltage in the relaxation oscillator 200, capacitor 230 is charged with current through FET 214. FET 214 and FET 212 are co-located during fabrication and are of the same size resulting in a current mirror configuration so that the current magnitude in FET 212 and FET 214 is the same. As capacitor 230 charges, the voltage at node 264 increases. When node 264 equals the voltage of node 260, the low power comparator 240 triggers, enabling the high power comparator 242. The capacitor 230 continues to charge and the voltage at node 264 continues to increase.

When the voltage at node 264 equals the voltage of node 262, the high power comparator 242 triggers, resulting in the output of comparator 242 going high also driving node 268 high. With node 268 high, flip-flop 246 is clocked and the voltage at output node OUT toggles forming a clock edge. In addition, a result of node 268 going high, FET 216 turns on and discharges capacitor 230 to the ground node 252. With capacitor 230 discharged, the voltage at node 264 is near ground voltage resulting in the reset of both comparators 240 and 242. The resetting of low power comparator 240 turns off the high power comparator 242, thus conserving power for the relaxation oscillator 200. The same charge/discharge process continues repeatedly and creates the oscillator action. The oscillator 200 will have a square wave output signal at the output node OUT with an approximately 50% duty cycle.

Using the low power comparator 240 to enable the high power comparator 242 for a short time when comparator 242 is needed to accurately detect the ascending voltage of node 264 saves power during the majority of the time while the voltage at node 264 is increasing. In the example arrangement, the low power comparator 240 was biased at 200 nA and the high power comparator 242 was biased at 5,000 nA. The 25:1 current ratio results in a significant improvement in the low power relaxation oscillator 200 over prior known oscillators. In arranging the value of resistors 220, 222 and 224, care is taken to ensure that over the operating temperature range, comparator 240 enables high power comparator 242 early enough in time to detect when the voltage at node 264 is equal to the voltage at node 262. For the example arrangement running at about ten kilohertz, resistor 220 was about five hundred thousand ohms and resistors 222 and 224 were each about two million ohms. Also in the example arrangement, the current source 248 was set at 50 nA and the mirrored FETS 212 and 214 each drew about 200 nA.

In the example relaxation oscillator 200, several aspects of the present application reduce frequency drift in the oscillator output frequency. The current mirror arrangement of FETs 210, 212 and 214 in the example relaxation oscillator 200 ensure that the capacitor 230 charges at a linear rate as opposed to the exponential charge curve found in a capacitor charged with a resistor coupled to a voltage source. Eliminating the resistor in the capacitor charging improves temperature independence, reducing frequency drift. Using the high power comparator 242 to detect the trigger voltage helps reduce temperature sensitivity because the latency variation due to temperature of the high power comparator 242 is very small compared to the time to charge node 264 to the voltage of node 262. The voltage at node 262 is somewhat independent of thermal variation with the pairing of the RTP and RTN resistors 222 and 224. The resistance at node 262 can vary slightly with temperature due to the composition of resistor 220, however, in the low power example relaxation oscillator 200, a frequency drift of less than 2% was achieved with a standard resistor formulation. The effective resistance formed by resistors 220, and the parallel resistance of 222 and 224, which is approximately (Resistance of 220+Resistance of 222||224), is arranged such that the resistance is optimally thermally stable.

Figure 3:
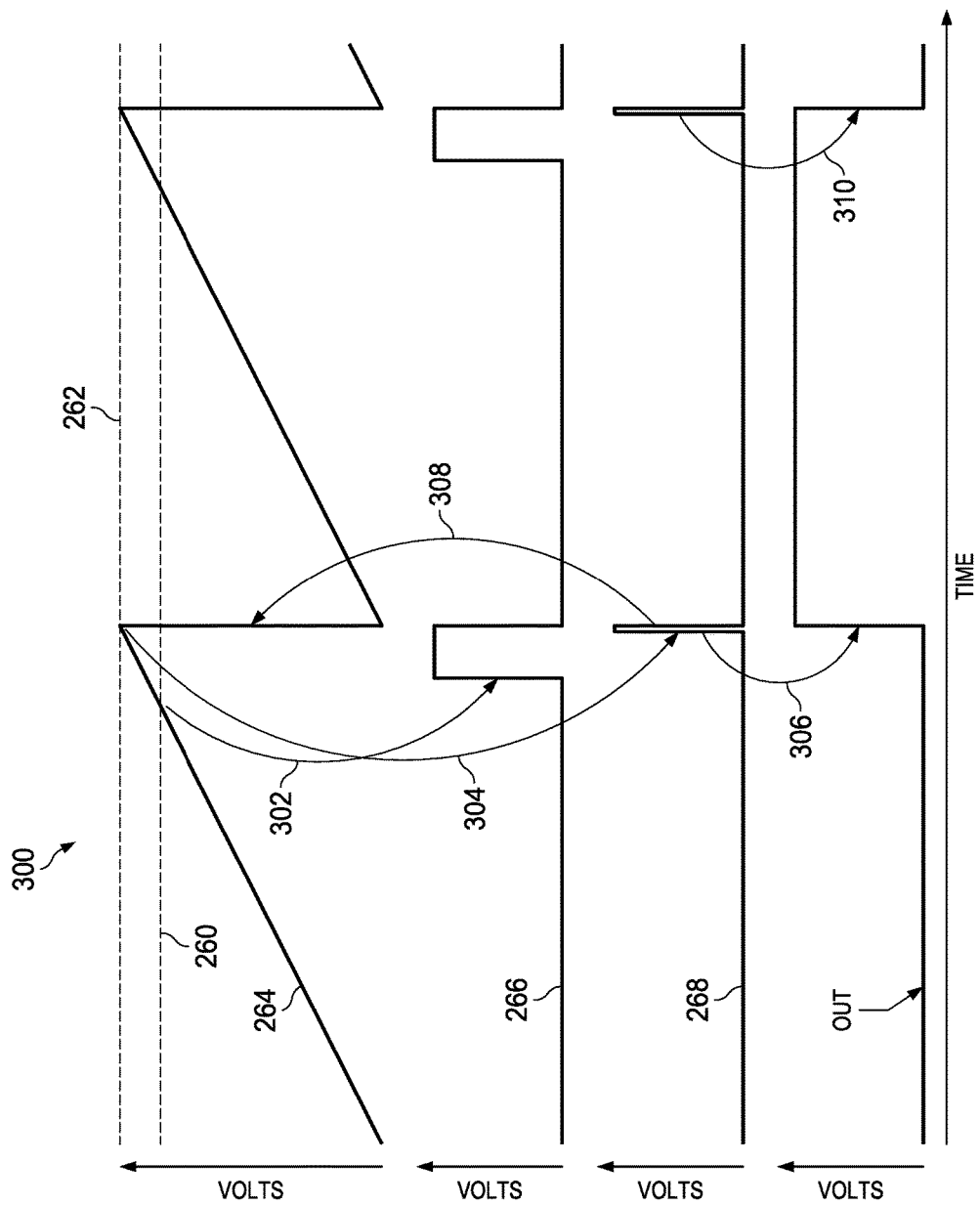
FIGS. 3A, 3B, 3C, and 3D are waveforms from the relaxation oscillator of FIG. 2.

In an additional arrangement that forms another aspect of the present application, a resistor (not shown in FIG. 3) can be used to create the current source 248 if another current source is not readily available in the system. Variations in the current through the FET 210 can be cancelled due to the differential voltage relationship of nodes 262 and 264.

The oscillator 200 can be implemented as a single standalone integrated circuit as indicated by the dotted line boundary surrounding 200 in FIG. 2. In an alternative aspect of the present application, the oscillator 200 can be formed with additional components on an integrated circuit such as a system on a chip (SOC) or system on an integrated circuit (SOIC). In still further alternative arrangements, the components forming the oscillator 200 in FIG. 2 can be formed as discrete components on a module or printed circuit board. Multichip modules and stacked die packages can be used.

FIGS. 3A, 3B, 3C, and 3D are waveforms from the relaxation oscillator of FIG. 2. In each of FIGS. 3A, 3B, 3C, and 3D, the horizontal or x-axis plots time increasing to the right. The vertical or y-axis for each of FIGS. 3A, 3B, 3C, and 3D plots volts, increasing upwards. The four timing waveforms of FIGS. 3A, 3B, 3C, and 3D correspond to voltages in the low power relaxation oscillator circuit 200 in FIG. 2.

In FIG. 3A, the capacitor voltage at node 264 is plotted. In FIG. 3B, the output of the low power comparator on node 266 is plotted. In FIG. 3C, the output of the higher power comparator on node 268 is plotted. In FIG. 3D, the oscillator output at node OUT is plotted. In FIG. 3A, there are two voltage levels indicated with dashed lines, the upper voltage corresponds to node 262 and the lower one corresponds to node 260.

In operation, beginning on the left side with the output OUT low in FIG. 3D and capacitor node 264 discharged as shown in FIG. 3A, the signal at node 264 shows capacitor 230 of FIG. 2 charging, as indicated by the signal 264 ramping in voltage. When the voltage at node 264 equals or exceeds the voltage at node 260, the output of the low power comparator 240 from FIG. 2 goes active. This is indicated by the arrow 302 and the waveform at node 266 going high. The high power comparator 242 is now enabled and begins operating and consuming current. The waveform at node 264 in FIG. 3A continues to increase in voltage while the waveform in FIG. 3B, showing the voltage at node 266 is active. When the voltage at node 264 (in FIG. 3A) equals or exceeds voltage at node 262, the high powered comparator 242 of FIG. 2 is triggered as indicated by arrow 304 and the waveform plotted in FIG. 3C, the voltage at node 268, transitioning high. Flip-flop 246 of FIG. 2 is toggled as a result of comparator 242 triggering. The output signal OUT switches to its high state as shown near region 306 in FIG. 3D. Another result of the comparator 242 toggle is that the FET 216 of FIG. 2 turns on and discharges capacitor 230, as indicated by waveform in FIG. 3A showing the voltage at node 264 and the voltage drop shown by arrow 308. The charging and discharging cycle continues with the only change being that on the subsequent triggering of 268, the output signal OUT toggles back to the low state as indicated by arrow 310 in FIG. 3D.

Figure 4:
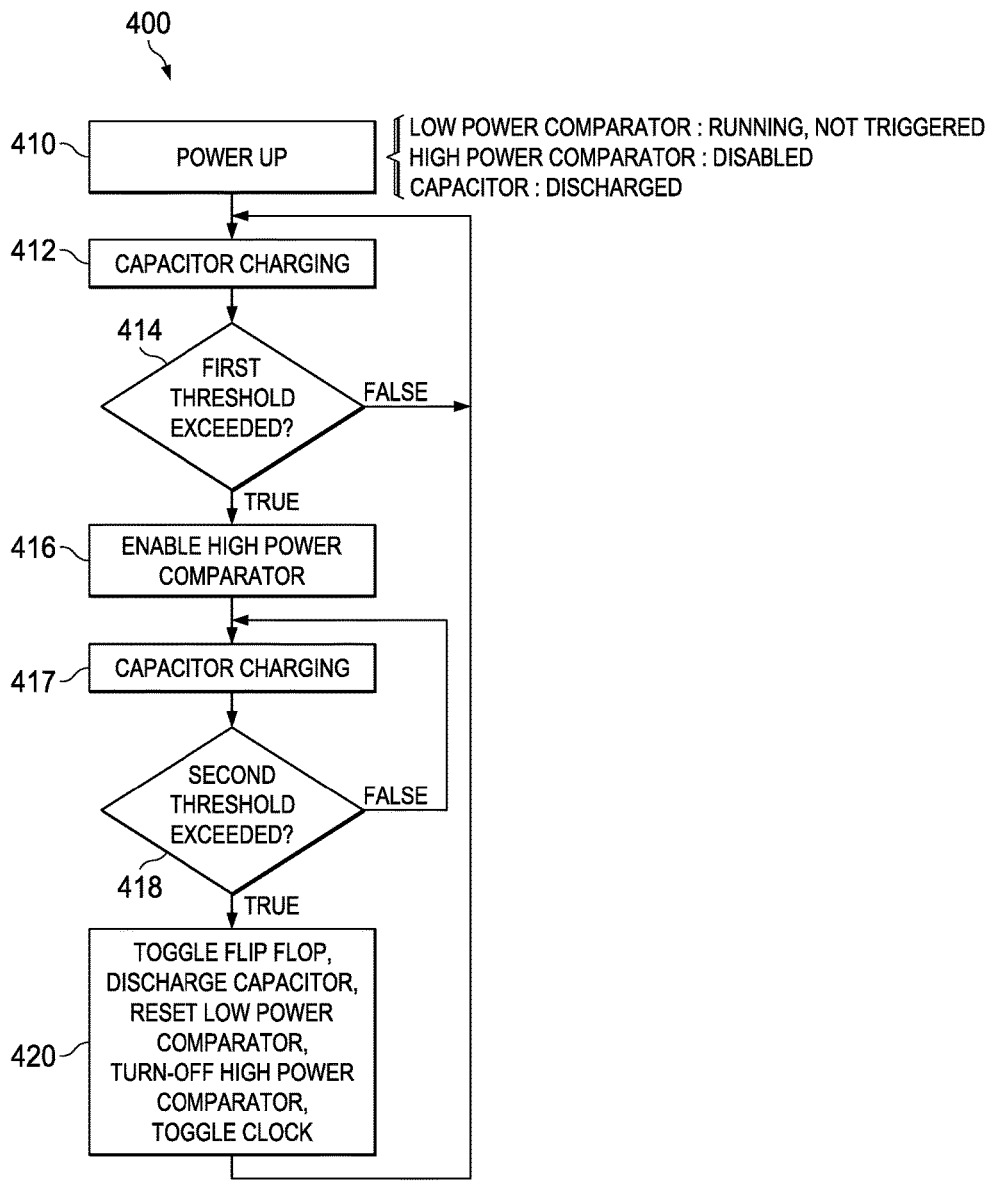
FIG. 4 is a flow diagram for a method that forms an additional aspect of the present application.

FIG. 4 is a flow diagram for a method that forms an additional aspect of the present application. In FIG. 4, method 400 begins at step 410, Power Up. At power up the first comparator is running and its output is low, a second high power comparator is not running and its output is low and the capacitor is discharged.

The method transitions to step 412 where the capacitor is charging. The method then transitions to the decision block at step 414. At step 414, a comparison is made between the voltage across the capacitor and a first threshold voltage. If the comparison is false, the method returns to step 412 and the capacitor continues to charge. If the comparison is true, the methods transitions to step 416.

In step 416, the high power comparator (242 in FIG. 2) is turned on. By delaying the turn on of this high power comparator during the first portion of the capacitor charging stage, the power consumption is reduced. By completing the voltage comparison using the high power comparator, frequency drift due to temperature dependence on comparator latency is negligible.

After enabling the high power comparator at step 416, the method transitions to step 417 and the capacitor (such as 230 in FIG. 2) continues to charge. At step 418, a second decision block is shown where the voltage across the capacitor is compared to a second threshold voltage that is higher than the first threshold. If the second threshold is not met, the method then transitions back to step 417 where the capacitor continues to charge. If the second threshold is exceeded, the comparison at step 418 is true and the method transitions to step 420.

At step 420, the flip flop toggles and the output signal changes state, the capacitor is discharged. At this time, the voltage at the low power comparator is not met and the low power comparator resets, resulting in the output of the low power comparator going low. The low output of the low power comparator turns off the high power comparator. The high power comparator output goes low.

The method then returns to step 412 and repeats. The output signal changes state each time the flip flop toggles at step 420, the output signal is therefore a square wave with an approximately 50% duty cycle. Other output duty cycles can be formed using logic gates and delay elements at the output.

In an arrangement that forms an aspect of the present application, the method of FIG. 4 can be performed by operating a circuit such as circuit 200 in FIG. 2. In other arrangements, the method can be performed using a programmable device such as state machine, microcontroller, or microprocessor coupled with comparators and capacitors. Analog and digital circuitry can be combined and operated to implement the method.

In an aspect of the present application, an arrangement for an oscillator includes a first comparator coupled to a capacitor that is charged by a current source, a second comparator that is coupled to the capacitor and that has higher power and a shorter delay time than the first comparator, a first reference voltage that is coupled to the first comparator, and a second reference voltage different from the first reference voltage that is coupled to the second comparator. The capacitor is coupled to the current source and charged until the voltage at the capacitor exceeds the first reference voltage, and the output of the first comparator becomes active. The output of the first comparator enables the second comparator. The capacitor continues to charge until the voltage at the capacitor exceeds the second reference voltage and the output of the second comparator becomes active.

The output of the second comparator toggles a flip-flop, resulting in the toggling of the output signal of the oscillator. A discharge circuit coupled to the output of the second comparator then discharges the capacitor. A resistor network forms the first reference voltage reference and the second reference voltage and includes temperature compensated resistors. The oscillator of the arrangement has minimal frequency drift over a wide range of operating temperatures. The use of the first comparator, a low power comparator, while charging the capacitor prior to enabling the second comparator, a higher power comparator, reduces overall power consumption in the oscillator.

In a described example, an apparatus includes: a capacitor coupled to receive a current at a first terminal and having a second terminal coupled to ground; a first comparator coupled to a voltage at the first terminal of the capacitor and to a first reference voltage; a second comparator coupled to the voltage at the first terminal of the capacitor and to a second reference voltage that is different from the first reference voltage, and having an enable input coupled to the output of the first comparator; a discharge circuit coupled to the capacitor and enabled by the output of the second comparator; and a toggle circuit coupled to the output of the second comparator.

In another aspect of the present application, in the apparatus, the first comparator is a low power comparator with a first delay time, and the second comparator is a high power comparator with a second delay time that is shorter than the first delay time. In a further aspect of the present application, the apparatus also includes a current reference source; and a first current mirror coupled to the current reference source and to the first terminal of the capacitor, configured to charge the capacitor with a current equal to the current reference source.

In still another aspect of the present application, the apparatus includes a second current mirror coupled to the current reference source and to a resistor network configured to output the first reference voltage and the second reference voltage. In still another example, the resistor network in the apparatus also includes a first resistor having the second reference voltage at a first node and the first reference voltage at a second node; and a temperature compensated resistance coupled between the second node and a ground terminal. In yet another example, the apparatus also includes the temperature compensated resistance including: a second resistor that has a resistance that is proportional to absolute temperature; and a third resistor that has a resistance that is inversely proportional to absolute temperature, the second resistor and the third resistor coupled in parallel between the second node and the ground terminal.

In still a further example, in the apparatus, the output signal has a frequency that is inversely proportional to the product of the capacitance and the first resistor. In still a further example, in the apparatus, the output signal has a duty cycle that is approximately 50%. In yet another example aspect of the present application, the capacitor is a metal insulator metal capacitor. In another example aspect, in the apparatus, the capacitor is trimmable. In an alternative aspect of the present application, the first comparator and the second comparator are differential comparators. In still another aspect of the present application, in the apparatus, the toggle circuit outputs a periodic output signal responsive to the output of the second comparator. In yet a further alternative example, the toggle circuit includes a flip-flop clocked by the output of the second comparator.

In another aspect of the present application, an integrated circuit includes: a toggle circuit coupled to an output signal; a first comparator coupled to a voltage at a capacitor and a first reference voltage; a second comparator having an enable input coupled to the output of the first comparator, and coupled to the voltage at the capacitor and a second reference voltage; a current source coupled to charge the capacitor; a discharge circuit coupled to discharge the capacitor responsive to the output of the second comparator; and a toggle circuit coupled to an output and configured to toggle between a first voltage level and a second voltage level, responsive to the output of the second comparator.

In yet another aspect of the present application, in the integrated circuit, the first comparator is a low power comparator having a first delay time, and the second comparator is a high power comparator having a second delay time less than the first comparator. In a further aspect of the present application, the integrated circuit further includes: a first current mirror coupled to the current source and having an output coupled to a resistor network. In still another aspect of the present application, in the integrated circuit, the resistor network further includes a first resistor having the second reference voltage at a first terminal and the first reference voltage at a second terminal; and a temperature compensated resistance coupled between the second terminal and a ground terminal. In yet another aspect of the present application, in the integrated circuit, the temperature compensated resistance further includes: a second resistance having a resistance proportional to absolute temperature, and a third resistance having a resistance inversely proportional to absolute temperature; the second and third resistances being coupled in parallel between the second terminal of the first resistor and the ground terminal.

In a further aspect of the present application, a method for outputting a periodic signal includes: charging a capacitor using a current from a current source; comparing a voltage at the capacitor to a first reference voltage; when the voltage at the capacitor exceeds the first reference voltage, subsequently comparing the voltage at the capacitor to a second reference voltage higher than the first reference voltage; when the voltage at the capacitor exceeds the second reference voltage; toggling an output signal and discharging the capacitor; and repeating the method.

In still another example aspect, in the above method, the method includes providing the first reference voltage and the second reference voltage by coupling a current source to a resistor network, the resistor network including a first resistor receiving a current from the current source and having the second reference voltage at a first terminal and the first reference voltage at a second terminal, and coupling a second resistor having a positive temperature coefficient and a third resistor having a negative temperature coefficient in parallel between the second terminal and a ground terminal.

Modifications are possible in the described example arrangements of the present application, and other arrangements are possible within the scope of the claims.

What is claimed is:

1. An apparatus, comprising:
   a capacitor coupled to receive a current at a first terminal and having a second terminal coupled to ground;
   a first comparator coupled to a voltage at the first terminal of the capacitor and to a first reference voltage;
   a second comparator coupled to the voltage at the first terminal of the capacitor and to a second reference voltage different from the first reference voltage, and having an enable input coupled to an output of the first comparator, and having an output;
   a discharge circuit coupled to the capacitor and enabled by the output of the second comparator; and
   a toggle circuit coupled to the output of the second comparator, and outputting a periodic signal, the periodic signal being coupled to the output of the first comparator only through the enable input of the second comparator.

2. The apparatus of claim 1 in which the first comparator is a low power comparator with a first delay time, and the second comparator is a high power comparator with a second delay time that is shorter than the first delay time.

3. The apparatus of claim 1, and further including: a current reference source; and a first current mirror coupled to the current reference source and to the first terminal of the capacitor, configured to charge the capacitor with a current equal to the current reference source.

4. The apparatus of claim 3 and further including: a second current mirror coupled to the current reference source and to a resistor network configured to output the first reference voltage and the second reference voltage.

5. The apparatus of claim 4, in which the resistor network further includes: a first resistor having the second reference voltage at a first node and the first reference voltage at a second node; and a temperature compensated resistance coupled between the second node and a ground terminal.

6. The apparatus of claim 5, in which the temperature compensated resistance further includes: a second resistor that has a resistance that is proportional to absolute temperature; and a third resistor that has a resistance that is inversely proportional to absolute temperature;
   the second resistor and the third resistor coupled in parallel between the second node and a ground terminal.

7. The apparatus of claim 5, in which the periodic signal has a frequency that is inversely proportional to a product of the capacitance and the first resistor.

8. The apparatus of claim 1 in which the periodic signal has a duty cycle that is approximately 50%.

9. The apparatus of claim 1, in which the capacitor is a metal-to-metal capacitor.

10. The apparatus of claim 1, in which the capacitor is trimmable.

11. The apparatus of claim 1, in which the first comparator and the second comparator are differential comparators.

12. The apparatus of claim 1, in which the toggle circuit toggles a voltage level of the periodic signal responsive to the output of the second comparator.

13. The apparatus of claim 12, in which the toggle circuit includes a flip-flop clocked by the output of the second comparator.

14. An integrated circuit, comprising:
    a capacitor having one terminal coupled to a power node and another terminal coupled to a ground node;
    a resistor network coupled between the power node and the ground node and providing a first reference voltage and a second reference voltage different from the first reference voltage;
    a first comparator having inputs coupled to the one capacitor terminal and the first reference voltage and having an output;
    a second comparator having an enable input connected to the output of the first comparator, having inputs coupled to the one capacitor terminal and the second reference voltage, and having an output;
    a discharge circuit coupled to discharge the capacitor responsive only to the output of the second comparator; and
    a toggle circuit having an output and configured to toggle a signal at the output between a first voltage level and a second voltage level, responsive to the output of the second comparator.

15. The integrated circuit of claim 14, in which the first comparator is a low power comparator having a first delay time, and the second comparator is a high power comparator having a second delay time less than the first delay time.

16. The integrated circuit of claim 14, and further including: a first current mirror coupled to the current source and having an output coupled to a resistor network.

17. The integrated circuit of claim 16, in which the resistor network further includes a first resistor having the second reference voltage at a first terminal and the first reference voltage at a second terminal; and a temperature compensated resistance coupled between the second terminal and a ground terminal.

18. The integrated circuit of claim 17, in which the temperature compensated resistance further includes: a second resistance having a resistance proportional to absolute temperature, and a third resistance having a resistance inversely proportional to absolute temperature; the second and third resistances being coupled in parallel between the second terminal of the first resistor and a ground terminal.

19. A method for outputting a periodic signal, comprising:
charging a capacitor using a current from a current source;
    comparing a voltage at the capacitor to a first reference voltage;
when the voltage at the capacitor exceeds the first reference voltage, subsequently comparing the voltage at the capacitor to a second reference voltage different from the first reference voltage;
when the voltage at the capacitor exceeds the second reference voltage;
toggling an output signal and discharging the capacitor; and
repeating the method.

20. The method of claim 19, and further including:
providing the first reference voltage and the second reference voltage by coupling a current source to a resistor network, the resistor network including a first resistor receiving a current from the current source and having the second reference voltage at a first terminal and the first reference voltage at a second terminal and coupling a second resistor having a positive temperature coefficient and a third resistor having a negative temperature coefficient in parallel between the second terminal and a ground terminal.

* * * * *